(12) United States Patent
Miyoshi et al.

(10) Patent No.: US 8,169,250 B2
(45) Date of Patent: May 1, 2012

(54) SIGNAL LEVEL CONVERSION CIRCUIT

(75) Inventors: Hideaki Miyoshi, Kanagawa-ken (JP);
Tetsuya Iwasaki, Kanagawa-ken (JP);
Taketoshi Tsujita, Kanagawa-ken (JP);
Tomohiko Konno, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/703,928

(22) Filed: Feb. 11, 2010

(65) Prior Publication Data
US 2010/0214002 A1 Aug. 26, 2010

(30) Foreign Application Priority Data
Feb. 20, 2009 (JP) ................. 2009-038641

(51) Int. Cl.
*H03L 5/00* (2006.01)
(52) U.S. Cl. ...................................... 327/333
(58) Field of Classification Search .......... None
See application file for complete search history.

(56) References Cited

U.S. PATENT DOCUMENTS

| | | | |
|---|---|---|---|
| 6,373,460 B1 * | 4/2002 | Kubota et al. ............ | 345/100 |
| 6,676,400 B2 * | 1/2004 | Ito ........................... | 425/145 |
| 6,856,173 B1 * | 2/2005 | Chun ....................... | 326/108 |
| 2004/0008193 A1 * | 1/2004 | Yu ........................... | 345/204 |
| 2007/0085589 A1 * | 4/2007 | Yoshikawa ............... | 327/333 |
| 2010/0127751 A1 * | 5/2010 | Lin ........................... | 327/333 |

FOREIGN PATENT DOCUMENTS

| | | |
|---|---|---|
| JP | 2003-133937 | 5/2003 |
| JP | 2003-188710 | 7/2003 |
| JP | 2006-100963 | 4/2006 |
| JP | 2007-228407 | 9/2007 |

* cited by examiner

*Primary Examiner* — Lincoln Donovan
*Assistant Examiner* — Khareem E Almo
(74) *Attorney, Agent, or Firm* — Turocy & Watson, LLP (57) ABSTRACT

A signal level conversion circuit includes three or more level shift circuits to output internal output signals upon receiving input signals, respectively. Each of the level shift circuits is formed of a common electrical element and an electrical element connected to the common electrical element. A voltage higher than that supplied to the common electrical element is supplied to the electrical element. A buffer circuit having an input tolerant function is provided in each of the common electrical elements. The internal output signals are set at lower level than the input signals by the buffer circuits, and the internal output signal outputted from one of the level shift circuits is further outputted via other level shift circuits.

5 Claims, 4 Drawing Sheets

SIGNAL LEVEL CONVERSION CIRCUIT

CROSS-REFERENCE TO RELATED APPLICATION

This application is based upon and claims the benefit of priority from prior Japanese Patent Application No. 2009-038641, filed Feb. 20, 2009, and the entire contents of which are incorporated herein by reference.

BACKGROUND OF THE INVENTION

1. Field of the Invention

The present invention relates to a signal level conversion circuit, and more particularly to a bidirectional conversion circuit capable of reducing the number of circuit elements without receiving restriction of utilized power supply voltages.

2. Description of the Related Art

Semiconductor integrated circuit (LSI) including a logic circuit or a sequence circuit formed of CMOS (Complementary Metal Oxide Semiconductor) transistors is generally provided with a signal conversion circuit to shift a signal level between different high potential power supplies. There are two types of the signal level conversion circuit which carries out the level conversion of the signal level. One is one way type in which the signal passes in one direction. Another is a bidirectional type in which the signal passes in both directions using two power sources. The two power-supply bidirectional type signal level conversion circuit is suitable for three or more electrical power systems.

In a Japanese laid open patent application No. 2007-228407, it is necessary to form a protection diode in a direction from an input/output terminal to a high potential power supply source in a signal level conversion circuit accepting three or more electrical power systems. When the protection diode is not formed in the direction from the input/output terminal to the high potential power supply source, there is a problem of receiving restriction of a level of the utilized power supply voltage (an input tolerant function is lost). Moreover, in this Japanese laid open patent application, since a bus switch is used as a level shift circuit, there is a problem that high speed correspondence is difficult.

BRIEF SUMMARY OF THE INVENTION

The present invention has been made to address the above mentioned problems. One object of the invention is to provide a signal level conversion circuit capable of reducing the number of circuit elements without receiving restriction of utilized power supply voltages.

Thus, according to one aspect of the invention, there is provided a signal level conversion circuit comprising: (a) a first level shift circuit to output a first internal output signal upon receiving a first input signal including; a first electrical element supplied with a first voltage, a first common electrical element connected to the first electrical element and supplied with a common voltage lower than the first voltage, and a first buffer circuit provided in the first common electrical element and having an input tolerant function, (b) a second level shift circuit to output a second internal output signal upon receiving a second input signal including; a second electrical element supplied with a second voltage higher than the common voltage, a second common electrical element connected to the second electrical element and supplied with the common voltage, and a second buffer circuit provided in the second common electrical element and having an input tolerant function, and (c) a third level shift circuit to output a third internal output signal upon receiving a third input signal including; a third electrical element supplied with a third voltage higher than the common voltage, a third common electrical element connected to the third electrical element and supplied with the common voltage, and a third buffer circuit provided in the third common electrical element and having an input tolerant function, and wherein each signal level of the first, second and third internal output signals is set lower than the first, second and third input signals by the first, second and third buffer circuits, and the internal output signal outputted from one of the first, second and third level shift circuits is further outputted via other level shift circuits.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A signal level conversion circuit according to an exemplary embodiment of the present invention, in particular, a bidirectional signal level conversion circuit capable of decreasing the number of elements to form the level conversion circuit will now be described with reference to the accompanying drawings wherein the same or like reference numerals designate the same or corresponding parts throughout the several views.

Figure 1:
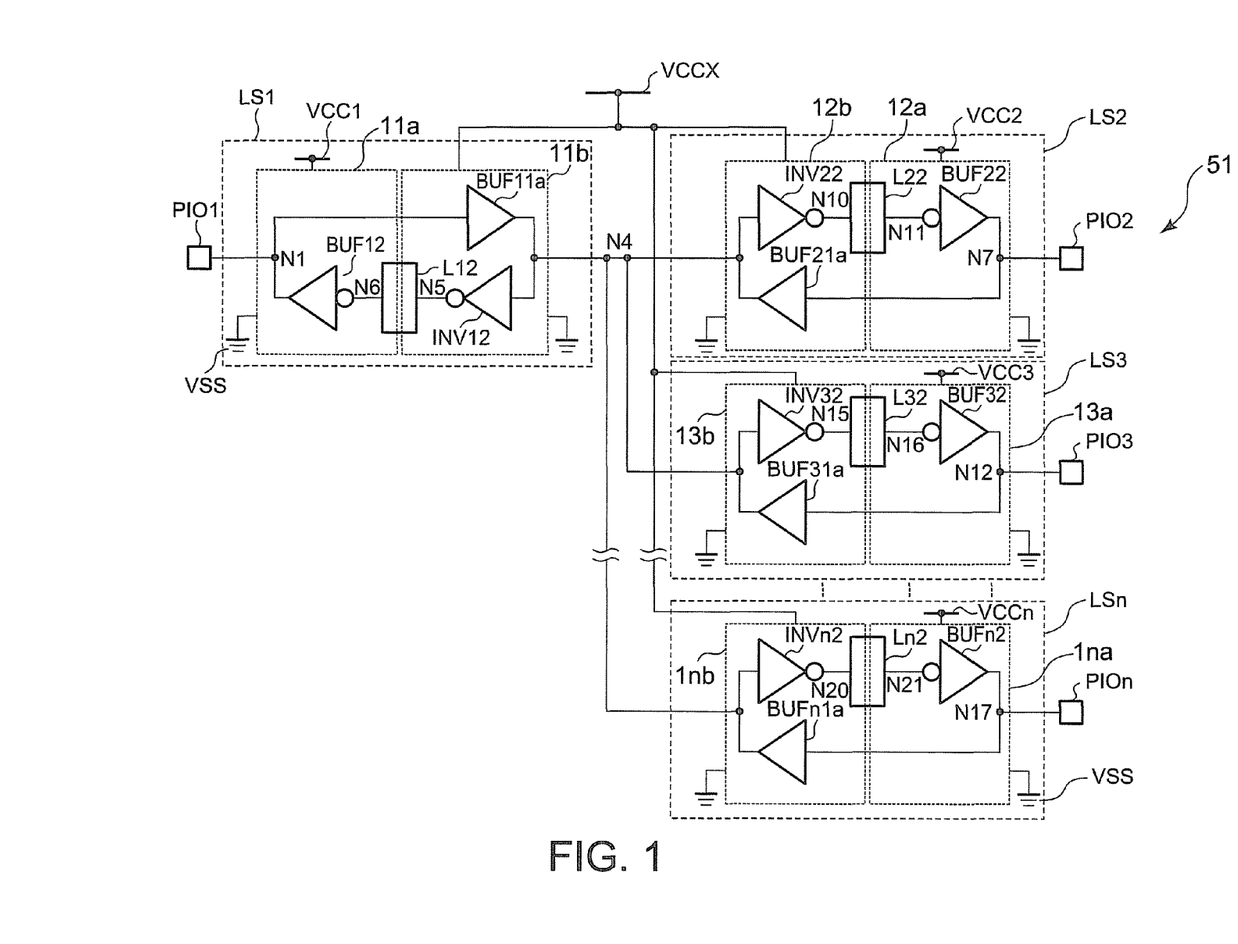
FIG. 1 is a circuit diagram showing a signal level conversion circuit according to a first embodiment of the present invention.
Figure 2:
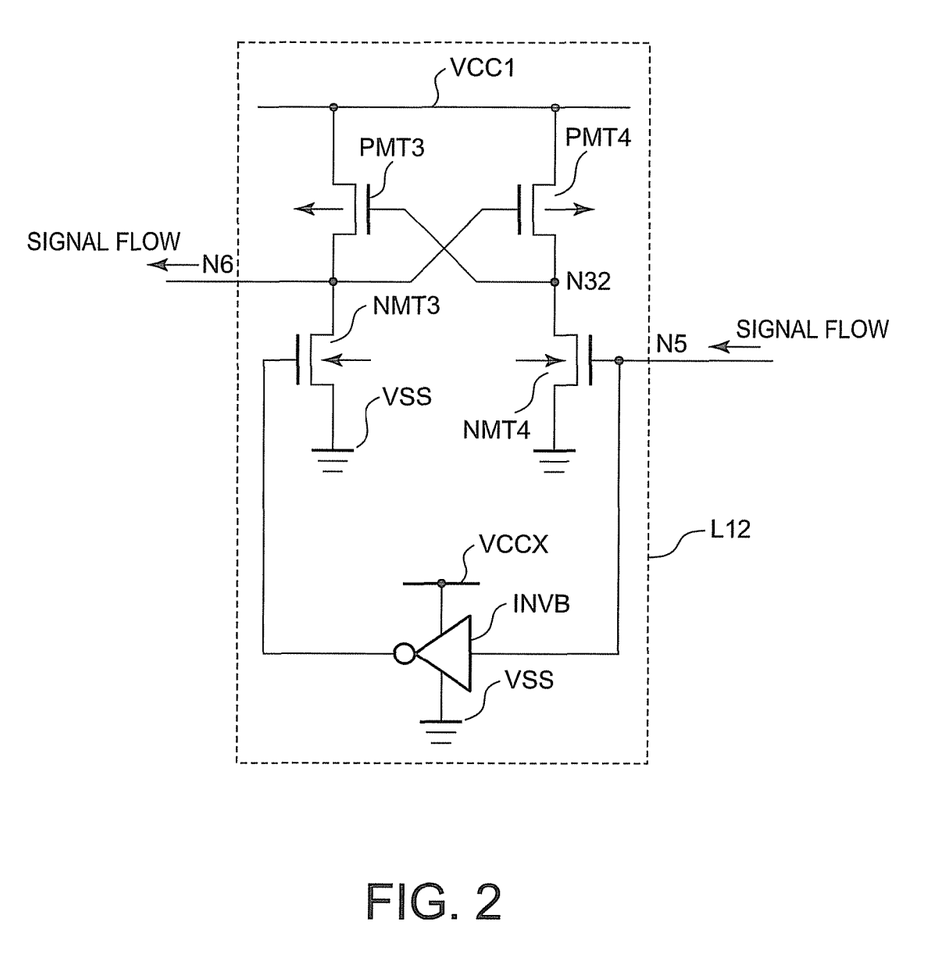
FIG. 2 is a circuit diagram showing a level conversion circuit used in the first embodiment of the present invention.

A bidirectional type signal conversion circuit according to a first embodiment of the present invention will be explained referring to FIGS. 1 and 2. FIGS. 1 and 2 show the signal conversion circuit and a level conversion circuit used in the signal conversion circuit in the first embodiment shown in FIG. 1, respectively. In this embodiment, a common high potential power is supplied to an inside of a level shift circuit.

As shown in FIG. 1, the bidirectional type signal level conversion circuit 51 includes a first level shift circuit LS1, a second level shift circuit LS2, a third level shift circuit LS3, a n-th level shift circuit LSn, an input/output terminal PIO1, an input/output terminal PIO2, an input/output terminal PIO3 and an input/output terminal PIOn. The bidirectional type signal level conversion circuit 51 includes n level shift circuits and n input/output terminals. Here, n is three or more integers. The signal level conversion circuit 51 is used for mobile terminal equipments, such as PDA.

An input signal inputted into the input terminal PIO1 is outputted to an internal input/output node N4 as a level shifted internal output signal by the first level shift circuit LS1. The level shifted internal output signal is inputted to the second level shift circuit LS2, the third level shift circuit LS3 and the n-th level shift circuit LSn. The level conversion by the signal conversion circuit 51 is carried out via a pair of the first level shift circuit LS1 and the second level shift circuit LS2, similarly via the first level shift circuit LS1 and the third level shift circuit LS3. Moreover, the level conversion is carried out via the first level shift circuit LS1 and the n-th level shift circuit LSn. The level shifted signals are outputted to the input/output terminal PIO2, the input/output terminal PIO3 and the input/output terminal PIOn, respectively.

The level conversion of an input signal inputted into the input terminal PIO2 is carried out via the second level shift circuit LS2 and the first level shift circuit LS1, and the level shifted signal is outputted to the input/output terminal PIO1 via the internal input/output node N4. Similarly, each of the output signals is outputted to the input/output terminals PIO3-PIOn of the level shift circuits LS3-LSn via the internal input/output node N4.

The level conversion of an input signal inputted into the input terminal PIO3 is carried out via the third level shift circuit LS3 and the first level shift circuit LS1, and the level sifted signal is outputted to the input/output terminal PIM. Similarly, the respective output signals are outputted to the input/output terminals PIO2-PIOn of the level shift circuits LS2-LSn via the internal input/output node N4.

The level conversion of an input signal inputted into the input terminal PIOn is carried out via the n-th level shift circuit LSn and the first level shift circuit LS1, and the level shifted signal is outputted to the input/output terminal PIO1. Similarly, the respective output signals are outputted to the input/output terminals PIO2-PIO (n−1) of the level shift circuits LS2-LS (n−1) via the internal input/output node N4.

The first level shift circuit LS1 is provided between the first input/output terminal PIO1 and the internal input/output node N4. The first level shift circuit LS1 carries out the level shift of the input signal inputted from the input/output terminal PIO1 and outputs the internal output signal to the internal input/output node N4. In an opposite direction, the first level shift circuit LS1 carries out the level shift of the signal of the internal output signal of the node N4 outputted from other level shift circuits, and the level shifted signal in the first level shift circuit LS1 is outputted to the input/output terminal PIM. An inverter circuit INV12, buffer circuits BUF11a, BUF12, and a level conversion circuit L12 are provided in the first level shift circuit LS1.

A first electrical element 11a and a first common electrical element 11b are provided in the first level shift circuit LS1. A high potential power VCC1 and a low potential power VSS are supplied to the first electrical element 11a. The buffer circuit BUF12 is provided in the first electrical element 11a. A common high potential power VCCX and the low potential power VSS are supplied to the common electrical element 11b. The inverter circuit INV12 and the buffer circuit BUF11a are provided in the common electrical element 11b.

A level conversion circuit L12 is provided between the first electrical element 11a and the first common electrical element 11b. The high potential power VCC1, the common high potential power VCCX and the low potential power VSS are supplied to the level conversion circuit L12. The buffer circuit BUF11a provided between a node N1 and the internal input/output node N4 drives a signal of the node N1 and outputs the driven signal to the internal input/output node N4. The signal level of the node N1 is shifted to smaller one by means of an input tolerant function which the buffer circuit BUF11a has. The tolerant function is to prevent current flow from an input terminal to a power supply terminal when input signals are set at a higher voltage than the power supply voltage.

The second level shift circuit LS2 is provided between the input/output terminal PIO2 and the internal input/output node N4. The second level shift circuit LS2 outputs an input signal inputted from the input/output terminal PIO2 to the internal input/output node N4. In an opposite direction, the second level shift circuit LS2 carries out the level shift of the signal of the internal output signal of the node N4 outputted from other level shift circuits, and the level shifted signal by the second level shift circuit LS2 is outputted to the input/output terminal PIO2. The second level shift circuit LS2 includes an inverter circuit INV22a, a buffer circuit BUF21a, a buffer circuit BUF22 and a level conversion circuit L22.

A second electrical element 12a and a second common electrical element 12b are provided in the second level shift circuit LS2. A high potential power VCC2 and the low potential power VSS are supplied to the second electrical element 12a. The buffer circuit BUF22 is provided in the second electrical element 12a. The common high potential power VCCX and the low potential power VSS are supplied to the common electrical element 12b. The inverter circuit INV22 and the buffer circuit BUF21a are provided in the common electrical element 12b.

A level conversion circuit L22 is provided between the second electrical element 12a and the second common electrical element 12b. The high potential power VCC2, the common high potential power VCCX and the low potential power VSS are supplied to the level conversion circuit L22. The buffer circuit BUF21a provided between a node N7 and the internal input/output node N4 drives an input signal of the node N7 and outputs an internal output signal to the node N4. By means of an input tolerant function of the buffer circuit BUF21a, the internal output signal level is made smaller than the input signal as well as the first level shift circuit LS1.

The third level shift circuit LS3 is provided between the input/output terminal PIO3 and the internal input/output node N4 and carries out the level shift of an input signal inputted from the input/output terminal PIO3. The level shifted signal is outputted to the internal input/output node N4. In an opposite direction, the third level shift circuit LS3 carries out the level shift of the signal of the internal output signal of the node N4 outputted from other level shift circuits, and the level shifted signal by the third level shift circuit LS3 is outputted to the input/output terminal PIO3. An inverter circuit INV32, a buffer circuit BUF31a, a buffer circuit BUF32, and a level conversion circuit L32 are provided in the third level shift circuit LS3.

A third electrical element 13a and a third common electrical element 13b are provided in the third level shift circuit LS3. A high potential power VCC3 and the low potential power VSS are supplied to the third electrical element 13a. A buffer circuit BUF32 is provided in the third electrical element 13a. The common high potential power VCCX and the low potential power VSS are supplied to the common electrical element 13b. The inverter circuit INV32 and the buffer circuit BUF31a are provided in the common electrical element 13b.

A level conversion circuit L32 is provided between the third electrical element 13a and the third common electrical element 13b. A third high potential power VCC3 and the common high potential power VCCX are supplied to the level conversion circuit L32. The buffer circuit BUF31a is provided between a node N12 and the internal input/output node N4. The buffer circuit BUF31a drives an input signal of the node N12 and outputs an internal output signal to the node N4. By means of an input tolerant function which the buffer circuit BUF31a has, the internal output signal level is made smaller than the input signal as well as the first and second level shift circuits LS1 and LS2.

The n-th level shift circuit LSn is arranged between the input/output terminal PIOn and the internal input/output node N4 and carries out the level shift of the input signal inputted from the input/output terminal PIOn. The output signal of the n-th level shift circuit LSn is outputted to the internal input/output node N4. In an opposite direction, the n-th level shift circuit LSn carries out the level shift of the signal of the internal output signal of the node N4 outputted from other level shift circuits, and the level shifted signal by the n-th level shift circuit LSn is outputted to the input/output terminal PIOn. An inverter circuit INVn2, a buffer circuit BUFn1a, a buffer circuit BUFn2, and a level conversion circuit Ln2 are provided in the n-th level shift circuit LSn.

A n-th electrical element 1na and a n-th common electrical element 1nb are provided in the n-th level shift circuit LSn. The n-th high potential power VCCn and the low potential power VSS are supplied to the n-th electrical element 1na. The buffer circuit BUFn2 is provided in the n-th electrical element 1na. The common high potential power VCCX and the low potential power VSS are supplied to the n-th common electrical element 1nb. An inverter circuit INVn2 and a buffer circuit BUFn1a are provided in the common electrical element 1nb.

A level conversion circuit Ln2 is provided between the n-th electrical element 1na and the n-th common electrical element 1nb. The high potential power VCCn, the common high potential power VCCX and the low potential power VSS are supplied to the level conversion circuit Ln2. A buffer circuit BUFn1a is provided between a node N17 and the internal input/output node N4. The buffer circuit BUFn1a drives an input signal of the node N17 and outputs an internal output signal to the node N4. By means of an input tolerant function of the buffer circuit BUFn1a, the internal output signal level is made smaller than the input signal as well as the first, second and third level shift circuits LS1, LS2 and LS3.

Here, voltage Vccx of the common high potential power VCCX is smaller than any of voltage Vcc1 of the high potential power VCC1, voltage Vcc2 of the high potential power VCC2, voltage Vcc3 of the high potential power VCC3 and voltage Vccn of the high potential power VCCn.

$$\text{Vccx} < \text{Vcc1}, \text{Vcc2}, \text{Vcc3}, \text{Vccn} \qquad \text{Formula (1)}$$

In the signal level conversion circuit 51 according to this embodiment, an input tolerant function is given to the inverter circuits INV12, INV22, INV32 and INVn2, the buffer circuits BUF11a, BUF21a, BUF31a and BUFn1a, respectively. Similarly, an output tolerant function is given to the buffer circuit BUF12, BUF11a, BUF22, BUF21a, BUF32, BUF31a, BUFn2 and BUFn1a, respectively.

Accordingly, in the state where the high potential power (VCC1, VCC2, VCC3, VCCn) is 0V, even when an input signal is high-level, unnecessary current does not flow. As there is no protection diode, the fall of the propagation delay time of the signal can be suppressed. In the signal level conversion circuit 51, since a bus switch is not used for level shift circuit, the fall of propagation delay time can be also suppressed. Moreover, since the input tolerant function is given to the buffer circuit BUF11a, BUF21a, BUF31a and BUFn1a in a direction from the respective input/output terminals of the level shift circuits LS1-LSn to the internal input/output node N4. Therefore, inverter circuits and level conversion circuits are omitted. According to this embodiment, the signal transfer time can be accelerated and the number of circuit elements to form the signal level conversion circuit can be also reduced.

The first level conversion circuit L12 of the first level shift circuit LS1 includes an inverter circuit INVB, Nch MOS transistors NMT3 and NMT4, Pch MOS transistors PMT3 and PMT4 as shown in FIG. 2. The first level conversion circuit L12 of the first level shift circuit LS1 carries out the level shift (to higher level) of a signal of a node N5, and outputs the level shifted signal to a node N6.

Source, gate and drain electrodes of the Pch MOS transistor PMT4 are connected to the high potential power VCC1, the node N6 and a node N32, respectively. Source, gate and drain electrodes of the Pch MOS transistor PMT3 are connected to the high potential power VCC1, the node N32 and the node N6, respectively. Drain, gate and source electrodes of the Nch MOS transistor NMT4 are connected to the node N32, the node N5 and the low potential power source VSS, respectively. Drain and source electrodes of the Nch MOS transistor NMT3 are connected to the node N6 and the low voltage power source VSS, respectively.

The inverter circuit INVB is provided between the common high potential power VCCX and the low potential power source VSS. An input signal is applied to the node N5 and the output signal of the inverter circuit INVB, that is, an inverted signal is applied to the gate electrode of the Nch MOS transistor NMT3.

With reference to the level conversion circuits L22, L32 and Ln2 of the second, third and n-th level shift circuits LS2, LS3 and LSn, the circuit structure is the same as the level conversion circuit L12 although the signal and the voltage value of high potential power VCCn are different each other. Therefore, illustration and explanation about the level conversion circuits L22, L32 and Ln2 are abbreviated.

As mentioned above, in the signal level conversion circuit 51 of this embodiment, each of the input/output terminals PIO1, PIO2, PIO3 and PIOn is formed in the first, second, third and n-th level shift circuits LS1, LS2, LS3 and LSn. The signal level conversion circuit 51 includes the first, second, third and n-th common electrical elements 11b, 12b, 13b and 1nb of the first, second, third and n-th level shift circuits LS1, LS2, LS3 and SLn, and the common high potential VCCX is supplied to the common electrical elements 11b, 12b, 13b and 1nb.

The common high potential power VCCX is set at lower voltage level than the high voltage power potential VCCn supplied to the first, second, third, n-th electrical elements 11a, 12a, 13a and 1na at input terminal side, respectively. The buffer circuit BUF11a which has an input tolerant function in the direction from the node N1 to the node N4 is provided in the first common electrical element 11b. Similarly, the buffer circuits BUF21a, BUF31a and the BUFn1a having input tolerant function are provided in the respective common electrical elements 12b, 13b and 1nb in a direction from the nodes N7, N12 and N17 to the internal input/output node N4, respectively.

According to this embodiment, the inverter circuits and the level conversion circuits in the level shift circuits are omitted in a direction from the input/output terminals to the internal input/output node N4, and the number of utilized circuit elements is reduced. Therefore, signal transfer time is shorten and a chip area is made small.

Figure 3:
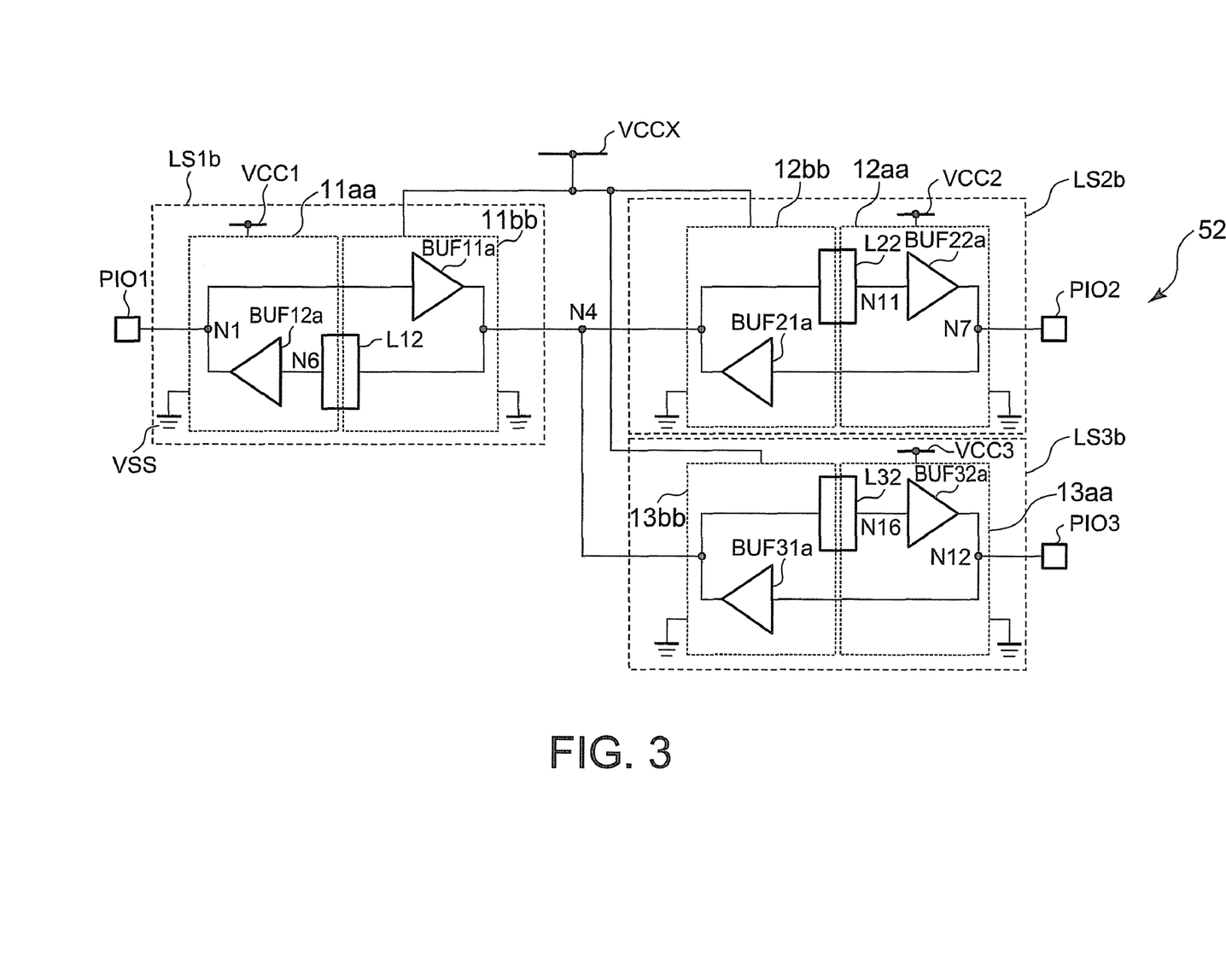
FIG. 3 is a circuit diagram showing a signal level conversion circuit according to a second embodiment of the present invention.

Next, a signal level conversion circuit according to a second embodiment of the present invention is explained with reference to a drawing. FIG. 3 is a circuit diagram showing a signal level conversion circuit. The structure of the level shift circuit is simplified in this embodiment.

As shown in FIG. 3, a bidirectional type signal level conversion circuit 52 includes first, second and third level shift circuits LS1b, LS2b and LS3b and input/output terminals PIO1, PIO2 and PIO3. The signal level conversion circuit 52 is used for mobile terminal equipment, such as PDA, for example.

The level conversion of an input signal inputted into the input terminal PIO1 is carried out via a pair of the first level shift circuit LS1b and the second level shift circuit LS2b, and similarly via the first level shift circuit LS1b and the third level shift circuit LS3b, respectively. The level shifted signal is outputted from the input/output terminal PIO2 or the input/output terminal PIO3 via an internal input/output node N4.

The level conversion of an input signal inputted into the input terminal PIO2 is carried out by a pair of the second level shift circuit LS2b and the first level shift circuit LS1b, and the level shifted signal is outputted to the input/output terminal PIM. Similarly, the internal output signal of the input/output node N4 is outputted to the input/output terminal PIO3 via the third level shift circuit LS3b.

The level conversion of an input signal inputted into the input terminal PIO3 is carried out by the third level shift circuit LS3b and the first level shift circuit LS1b, and the level shifted signal is outputted to the input/output terminal PIM. Similarly, the internal output signal of the input/output node N4 is outputted to the input/output terminal PIO2 via the second level shift circuit LS2b.

The first level shift circuit LS1b is provided between the input/output terminal PIO1 and the input/output node N4 and carries out the level shift of an input signal inputted into the input/output terminal PIO1. The first level shift circuit LS1b outputs an internal output signal to the input/output node N4. In an opposite direction, the first level shift circuit LS1b carries out the level shift of the signal of the internal output signal of the node N4 outputted from the level shift circuits LS2b and LS3b, and the level shifted signal by the first level shift circuit LS1b is outputted to the input/output terminal PIO1. A buffer circuit BUF11a, a buffer circuit BUF12a and a level conversion circuit L12 are formed in the first level shift circuit LS1b.

A first electrical element 11aa and a first common electrical element 11bb are provided in the first level shift circuit LS1b. A high potential power VCC1 and a low potential power VSS are supplied to the first electrical element 11aa. A buffer circuit BUF12a is provided in the first electrical element 11aa. A common high potential power VCCX and a low potential power VSS are supplied to the common electrical element 11bb. The buffer circuit BUF11a is provided in the first common electrical element 11bb.

A level conversion circuit L12 is provided between the first electrical element 11aa and the first common electrical element 11bb. The high potential power VCC1, the common high potential power VCCX and the low potential power VSS are supplied to the level conversion circuit L12.

The buffer circuit BUF12a is provided between a node N6 and a node N1. The buffer circuit BUF12a drives a signal at the node N6 and outputs the driven signal to the node N1. The second level shift circuit LS2b is provided between the input/output terminal PIO2 and the internal input/output node N4. The second level shift circuit LS2b carries out the level shift of an input signal inputted into the input/output terminal PIO2 and outputs an output signal to the internal input/output node N4. In an opposite direction, the first level shift circuit LS2b carries out the level shift of the signal of the internal output signal of the node N4 outputted from the level shift circuits LS1b and LS3b, and the level shifted signal by the second level shift circuit LS2b is outputted to the input/output terminal PIO2. A buffer circuit BUF21a, a buffer circuit BUF22a and a level conversion circuit L22 are formed in the second level shift circuit LS2b.

A second electrical element 12aa and a second common electrical element 12bb are provided in the second level shift circuit LS2b. A high potential power VCC2 and a low potential power are supplied to the second electrical element 12aa. A buffer circuit BUF22a is provided in the second electrical element 12aa. A common high potential power VCCX and the low potential power VSS are supplied to the common electrical element 12bb. The buffer circuit BUF21a is also provided in the common electrical element 12bb.

A level conversion circuit L22 is provided between the second electrical element 12aa and the second common electrical element 12bb. The high potential power VCC2, the common high potential power VCCX and the low potential power VSS are supplied to the level conversion circuit L22. The buffer circuit BUF22a provided between a node N11 and a node N7 drives a signal of the node N11 and outputs the driven signal to the node N7.

The third level shift circuit LS3b is provided between the input/output terminal PIO3 and the internal input/output node N4. The third level shift circuit LS3b carries out the level shift of an input signal inputted into the input/output terminal PIO3. The third level shift circuit LS3b outputs the level shifted signal to the internal input/output node N4. In an opposite direction, the third level shift circuit LS1b carries out the level shift of the signal of the internal output signal of the node N4 outputted from the level shift circuits LS1b and LS2b, and the level shifted signal by the third level shift circuit LS3b is outputted to the input/output terminal PIO3. A buffer circuit BUF31a, a buffer circuit BUF32a, and a level conversion circuit L32 are formed in the third level shift circuit LS3b.

A third electrical element 13aa and a third common electrical element 13bb are provided in the third level shift circuit LS3b. A high potential power VCC3 and the low potential power VSS are supplied to the third electrical element 13aa. The buffer circuit BUF32a is provided in the third electrical element 13aa. The common high potential power VCCX and the low potential power VSS are supplied to the third common electrical element 13bb. The buffer circuit BUF31a is provided in the third common electrical element 13bb.

A level conversion circuit L32 is provided between the third electrical element 13aa and the third common electrical element 13bb. The high potential power VCC3, the common high potential power VCCX and the low potential power VSS are supplied to the level conversion circuit L32. The buffer circuit BUF32a provided between a node N16 and a node N12 drives a signal of the node N16 and outputs the driven signal to the node N12.

Here, voltage Vccx of the, common high potential power VCCX is smaller than any of voltage Vcc1 of the high potential power VCC1, voltage Vcc2 of the high potential power VCC2, voltage Vcc3 of the high potential power VCC3 and voltage Vccn of the high potential power VCCn:

$$Vccx < Vcc1, Vcc2, Vcc3, Vccn$$

In the signal level conversion circuit 52 of this embodiment, an input tolerant function is given to the buffer circuits BUF11a, BUF21a, and BUF31a and the level conversion circuits L12 L22 and L32, respectively. Similarly, an output tolerant function is given to the buffer circuits BUF11a, BUF12a, BUF21a, BUF22a, BUF31a and BUF32a, respectively. Owing to above input and output tolerant function, in the state where the high potential power (VCC1, VCC2, VCC3) is 0V, even when an input signal is high-level, unnecessary current does not flow. Since there is no protection diode, the fall of the propagation delay time of the signal can be suppressed. Moreover, in this signal level conversion circuit 52, since the bus switch is not used for level shift circuit, the fall of propagation delay time can be also suppressed. Furthermore, inverter circuits and level conversion circuits in a direction from the input/output terminals to the internal input/output node N4 are omitted. The inverter circuits in the direction from an internal input/output node N4 to the level conversion circuits L12, L22 and L32 are also omitted and the number of circuit elements is reduced. Accordingly, signal transfer time can be accelerated and a circuit scale is also made smaller.

As mentioned above, the signal level conversion circuit 52 of this embodiment includes the first, second and third level shift circuits LS1b, LS2b and LS3b, and the input/output terminals PIO1, PIO2 and PIO3. The signal level conversion circuit 52 also includes the first, second and third common electrical elements 11bb, 12bb and 13bb of the first, second and third level shift circuits LS1b, LS2b and LS3b. The common high potential power VCCX is supplied to the common electrical elements 11bb, 12bb and 13bb. The voltage level of the common high potential power VCCX is set at lower one than the high potential power VCC1, VCC2 and VCC3 supplied to the first, second and third electrical elements 11aa, 12aa and 13aa of the first, second and third level shift circuits LS1b, LS2b and LS3b, respectively.

Furthermore, the level conversion circuit L12 and the buffer circuit BUF12a are provided in a direction from the internal input/output node N4 to the node N1 in the first level shift circuit LS1b. The level conversion circuit L22 and the buffer circuit BUF22a are provided in a direction from the internal input/output node N4 to the node N7 in the second level shift circuit LS2b. Similarly, the level conversion circuit L32 and the buffer circuit BUF32a are provided in a direction from the internal input/output node N4 to the node N12 in the third level shift circuit LS3b.

According to this embodiment, since the inverter circuits are omitted in the both directions between the input/output terminals and the internal input/output node N4, signal transfer time can be more accelerated than the first embodiment, and the number of elements is also reduced, which results in small chip size. In this embodiment, although three level shift circuits are provided, it does not necessarily limit to this. N level shift circuits may be provided as well as the first embodiment. (however, n is four or more integers)

Figure 4:
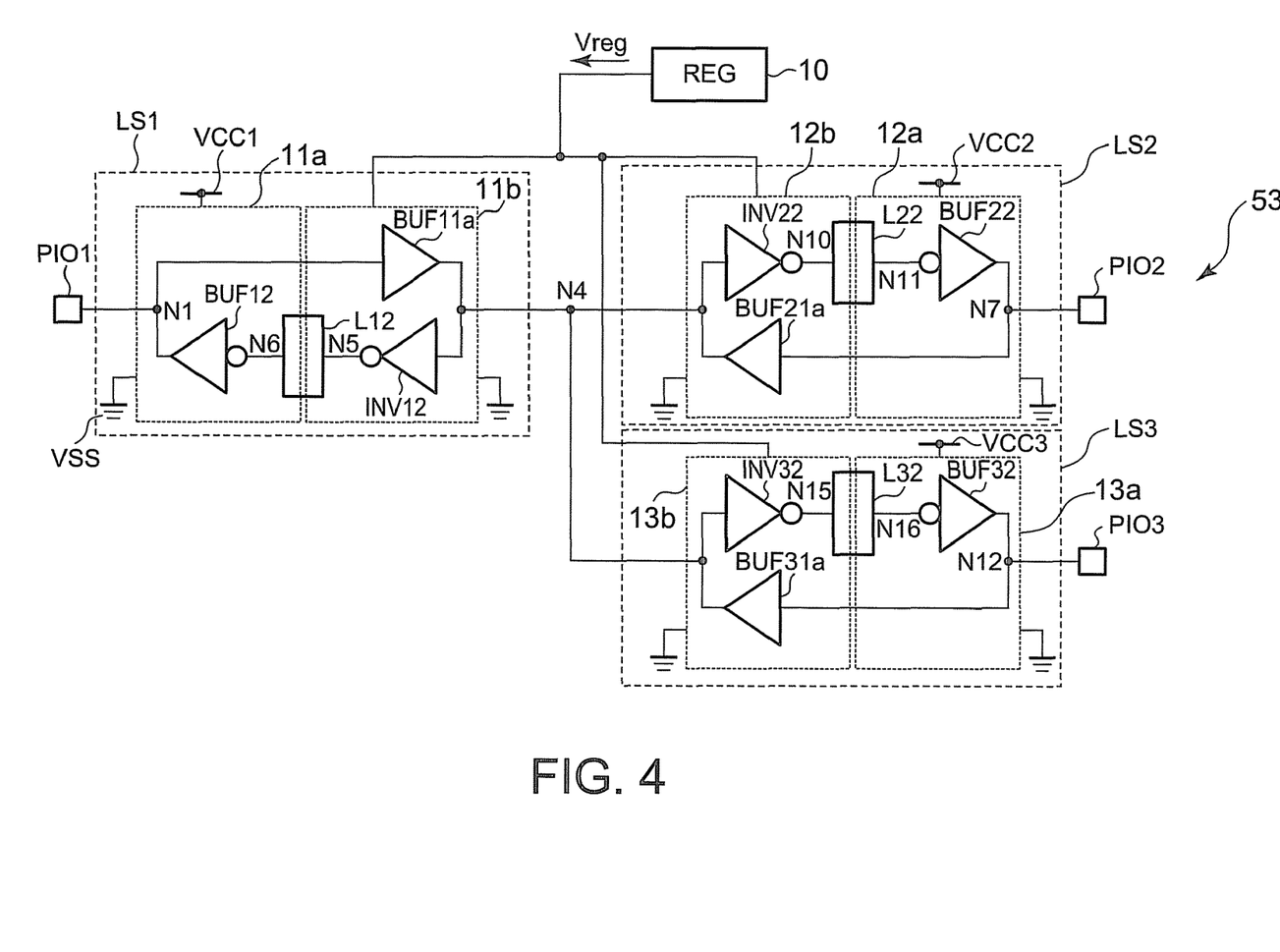
FIG. 4 is a circuit diagram showing a signal level conversion circuit according to a third embodiment of the present invention.

Next, a signal level conversion circuit according to a third embodiment of the present invention is explained with reference to a drawing. FIG. 4 is a circuit diagram showing a structure of a signal level conversion circuit. Since the circuit diagram according to this embodiment is almost the same as the first embodiment except a regulator circuit, the corresponding explanation will be abbreviated.

As shown in FIG. 4, a common high voltage power is generated by a regulator circuit 10. The signal level conversion circuit 53 includes the regulator circuit 10, first, second and third level shift circuits LS1, LS2 and LS3, and input/output terminals PIO1, PIO2, and PIO3. The signal level conversion circuit 53 is used for mobile terminal equipments, such as PDA, for example.

The regulator circuit 10 generates a voltage Vreg based on a potential power generated in the signal level conversion circuit 53 or by an external power supply and supplies the voltage Vreg to common electrical elements 11b, 12b, and 13b.

Here, the voltage Vreg is smaller than any of the voltage Vcc1 of high potential power VCC1, voltage Vcc2 of high potential power VCC2 and voltage Vcc3 of high potential power VCC3.

$$Vreg < Vcc1, Vcc2, Vcc3 \quad \text{Formula (2)}$$

The voltage Vreg is set larger than minimum operation voltages of the first, second and third level shift circuits LS1, LS2 and LS3.

In the signal level conversion circuit 53 according to this embodiment, since a bus switch is not used for the level shift circuits, the fall of propagation delay time can be suppressed. Furthermore, since the inverter circuits and the level conversion circuits are omitted in a direction from the input/output terminal side to the internal input/output node N4, signal transfer time can be accelerated and the number of elements is also reduced, which results in reduction of a circuit scale.

The regulator circuit 10 supplies the voltage Vreg to common electrical elements 11b, 12b, and 13b. The voltage Vreg is set up lower than high potential powers VCC1, VCC2 and VCC3 supplied to the first electrical element 11a, the second electrical element 12a and the third electrical element 13a, respectively.

For this reason, the voltage of the high potential power supplied to the first, second and third electrical elements 11a, 12a and 13a of the first, second and third level shift circuit LS1, circuit LS2 and LS3 can be set up arbitrarily without providing a margin.

Although the regulator circuit 10 generates the common high potential power in the third embodiment, a reference voltage (for example, 1.25V) generated in a band gap reference circuit may be used as a voltage of common high potential power.

The present invention is not limited directly to the above described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined. It is to therefore be understood that within the scope of the appended claims, the present invention may be practiced, other than as specifically disclosed herein.

What is claimed is:

1. A signal level conversion circuit, comprising:
  (a) a first level shift circuit to output a first internal output signal upon receiving a first input signal including:
    a first electrical element supplied with a first voltage,
    a first common electrical element connected to the first electrical element and supplied with a common voltage lower than the first voltage; and
    a first buffer circuit provided in the first common electrical element and having an input tolerant function;
  (b) a second level shift circuit to output a second internal output signal upon receiving a second input signal including;
    a second electrical element supplied with a second voltage higher than the common voltage,
    a second common electrical element connected to the second electrical element and supplied with the common voltage,
    a second buffer circuit provided in the second common electrical element and having an input tolerant function, and
  (c) a third level shift circuit to output a third internal output signal upon receiving a third input signal including:
    a third electrical element supplied with a third voltage higher than the common voltage, a third common electrical element connected to the third electrical element and supplied with the common voltage, and a third buffer circuit provided in the third common electrical element and having an input tolerant function, and wherein each signal level of the first, second and third internal output signals is set lower than the first, second and third input signals by the first, second and third buffer circuits, and the internal output signal outputted from one of the first, second and third level shift circuits is further outputted via other level shift circuits, each of the first, second and third level shift circuits includes a level conversion circuit and an internal output signal outputted from one of the first, second and third level shift circuits is inputted to each level conversion circuit of other level shift circuits; and each of the first, second and third common electrical elements includes an inverter circuit connected to the level conversion circuit, and the internal output signal is inputted to the inverter circuit.

2. The signal level conversion circuit according to claim 1, wherein the level conversion circuit, the buffer circuit and the inverter circuit are formed of CMOS (Complementary Metal Oxide Semiconductor) transistors.

3. The signal level conversion circuit according to claim 1, wherein the common voltage is generated by a regulator circuit.

4. The signal level conversion circuit according to claim 1, wherein the common voltage is generated by a band reference circuit.

5. The signal level conversion circuit according to claim 1, wherein the signal level conversion circuit is a bidirectional type in which the signal passes bi-directionally.

* * * * *